United States Patent
El-Sharawy

[11] Patent Number: 6,008,694
[45] Date of Patent: Dec. 28, 1999

[54] DISTRIBUTED AMPLIFIER AND METHOD THEREFOR

[75] Inventor: El-Badawy Amien El-Sharawy, Gilbert, Ariz.

[73] Assignee: National Scientific Corp., Pheonix, Ariz.

[21] Appl. No.: 09/113,724

[22] Filed: Jul. 10, 1998

[51] Int. Cl.[6] .................................................. H03F 3/60
[52] U.S. Cl. ........................................ 330/54; 330/124 R
[58] Field of Search ................................. 330/54, 124 R, 330/286, 295

[56] References Cited

U.S. PATENT DOCUMENTS

| | | | |
|---|---|---|---|
| 2,210,028 | 8/1940 | Doherty | 179/171 |
| 2,670,408 | 2/1954 | Kelley | 179/171 |
| 2,863,007 | 12/1958 | Fischer | 179/171 |
| 3,176,237 | 3/1965 | Liger | 330/53 |
| 3,210,682 | 10/1965 | Sosin | 330/54 |
| 4,337,439 | 6/1982 | Sosin | 330/54 |
| 4,543,535 | 9/1985 | Ayasli | 330/53 |
| 4,591,802 | 5/1986 | Asazawa | 330/277 |
| 4,769,618 | 9/1988 | Parish et al. | 330/277 |
| 4,853,649 | 8/1989 | Seino et al. | 330/277 |
| 5,012,203 | 4/1991 | Beyer et al. | 330/286 |
| 5,017,887 | 5/1991 | Gamand | 330/277 |
| 5,367,267 | 11/1994 | Fuchs | 330/54 |
| 5,414,387 | 5/1995 | Nakahara et al. | 330/54 |
| 5,485,118 | 1/1996 | Chick | 330/54 |

*Primary Examiner*—Robert Pascal
*Assistant Examiner*—Henry Choe
*Attorney, Agent, or Firm*—Meschkow & Gresham, P.L.C.; Lowell W. Gresham; Jordan M. Meschkow

[57] ABSTRACT

A distributed amplifier (10) configured to amplify an input signal (20) is presented. Within the amplifier (10), a first input phase-shift element (40) shifts the input signal (20) into a first shifted input signal (56). A first active element (18'), coupled to the first input phase-shift element (40), amplifies the first shifted input signal (56) into a first amplified signal (58). A second phase-shift element (42), coupled to the first input phase-shift element (40), shifts the first shifted input signal (56) into a second shifted input signal (62). A second active element (18"), coupled to the second phase-shift element (42), amplifies the second shifted input signal (62) into a second amplified signal (64). A first output phase-shift element (44), coupled to the first active element (18'), shifts the first amplified signal (58) into a first shifted amplified signal (60). A second output phase-shift element (46), coupled to the first output phase-shift element (44) and the second active element (18"), shifts the first shifted amplified signal (60) and the second amplified signal (64) into an output signal (24).

21 Claims, 2 Drawing Sheets

DISTRIBUTED AMPLIFIER AND METHOD THEREFOR

TECHNICAL FIELD OF THE INVENTION

The present invention relates to the field of electronic amplifiers. More specifically, the present invention relates to the field of distributed amplifiers, as are occasionally used in connection with microwave communications.

BACKGROUND OF THE INVENTION

Distributed amplification is the amplification of portions of a signal along the length of a first (input) transmission line by discrete active elements (amplifiers), the outputs of which are combined along a second (output) transmission line to produce the resultant amplified signal.

Each active element in a distributed amplifier contains spurious reactances, mostly capacitive, which impact upon the input and output impedances of those devices. A properly designed circuit containing these active elements compensates for these spurious reactances so that they will have minimum effect upon the transfer of power at the desired operating frequencies. Traditionally, this is accomplished by coupling both the inputs and the outputs of the active elements to compensatory networks. Such networks contain both inductances and capacitances along their lengths so as to appear as short lengths of transmission lines having specific characteristic impedances and operating over wide frequency bands. Each of the input and output networks may therefore be considered a virtual transmission line. In this approach, the input and output terminals of the active elements are connected at regular intervals along the input and output virtual transmission lines, respectively.

In the above and related implementations, the input and output virtual transmission lines are designed to have constant characteristic impedances over their lengths. This allows the theoretical gain of the distributed amplifier to approach the sum of the gains of the individual active elements. Simultaneously, the upper limits of the amplifier bandwidth are extended to the point where the spurious capacitance compensation no longer holds true. This results in a distributed amplifier that retains the wideband performance of the virtual transmission lines.

Although distributed amplifiers are highly attractive for those applications requiring a high gain-bandwidth product, they are not so well suited for applications requiring high output power. This is because the output power of a uniformly distributed amplifier is limited to the power-handling capability of the final active element in the amplifier. Each active device in a distributed amplifier contributes an equal output current to the output virtual transmission line. These currents progressively accumulate in the direction of the load. Since the characteristic impedance of the output virtual transmission line is constant throughout its length, the voltage across each successive active element must be greater so that the voltage-to-current ratio remains constant. Therefore, a conventional uniformly distributed amplifier is designed so that the final active element operates optimally within its rated voltage and current specifications. All preceding active elements accordingly operate suboptimally.

Additionally, conventional distributed amplifiers operate with matched-load power transfers. Since the virtual transmission lines appear as true transmission lines to the circuit, they have a characteristic impedance that needs be terminated to prevent interference from signal reflection. Since one of the purposes of the virtual transmission lines is to compensate for the spurious capacitive reactance of the active elements, they are themselves predominantly reactive. Termination becomes increasingly important with reactive characteristic impedances. In a terminated transmission line, approximately one-half the power is dissipated in the terminating impedance. Since there are typically both an input and an output virtual transmission line, only one-quarter of the output power is available for a given input signal.

Also of significance in traditional distributed amplifiers is odd-harmonic generation. Since each active element amplifies a portion of the input signal at a different phase angle, the output signal is comprised of the sum of partial-amplification products. Theoretically, the output virtual transmission line delays each partial product by just the proper amount so that all partial products are in phase when summed. In practice, this leads to a distortion of the output signal, hence an in-phase summing of odd harmonics. This produces significant third-harmonic distortion. Various techniques, some quite complex, are used to curtail this third-harmonic distortion.

The current state of the art in the manufacture of monolithic power field-effect transistors or other "active elements" lends itself to pairs of such transistors per substrate. As these transistor pairs are ideally suited for power output applications, the implementation of two-stage distributed amplifiers rises correspondingly in importance. Traditional distributed amplifier implementations gain efficiency and performance only with more than two stages. With more than two stages, more than one pair of monolithic transistors is required. Since the resultant active elements do not all share the same substrate, they thus do not share the same spurious capacitance values, gain, etc. These factors may cause a decrease in performance and/or an increase in design complexity.

SUMMARY OF THE INVENTION

Accordingly, it is an advantage that the present invention provides an improved distributed amplifier and method.

It is another advantage of the present invention that a distributed amplifier is provided in which the input and output virtual transmission lines vary in characteristic impedance over their length which successfully compensating for the spurious capacitance of the active elements.

It is another advantage of the present invention that a distributed amplifier is provided in which conjugate matching is used to minimize or eliminate the need for termination impedances on both the input and output virtual transmission lines while maintaining sufficient operational bandwidth to suit a wide variety of communications requirements.

It is again an advantage of the present invention that a distributed amplifier is provided in which third-harmonic distortion is inherently suppressed.

It is yet another advantage of the present invention that a two-stage distributed amplifier is provided in order to optimize the use of current-technology monolithic active elements.

These and other advantages of the present invention are realized in one form by a distributed amplifier configured to amplify an input signal possessing a predetermined wavelength $\lambda$. In the distributed amplifier, a first input phase-shift element shifts the input signal in phase by $\lambda/4$ and produces a first shifted input signal. A first active element receives the first shifted input signal and produces a first amplified signal. A second phase-shift element shifts the first shifted input signal in phase by $\lambda/4$ and produces a second shifted input signal. A second active element receives the second shifted input signal and produces a second amplified signal. A first output phase-shift element shifts the first amplified signal in phase by $\lambda/4$ and produces a first shifted amplified signal. And, a second output phase-shift element shifts the first shifted amplified signal and the second amplified signal in phase by $\lambda/4$ and produces an output signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
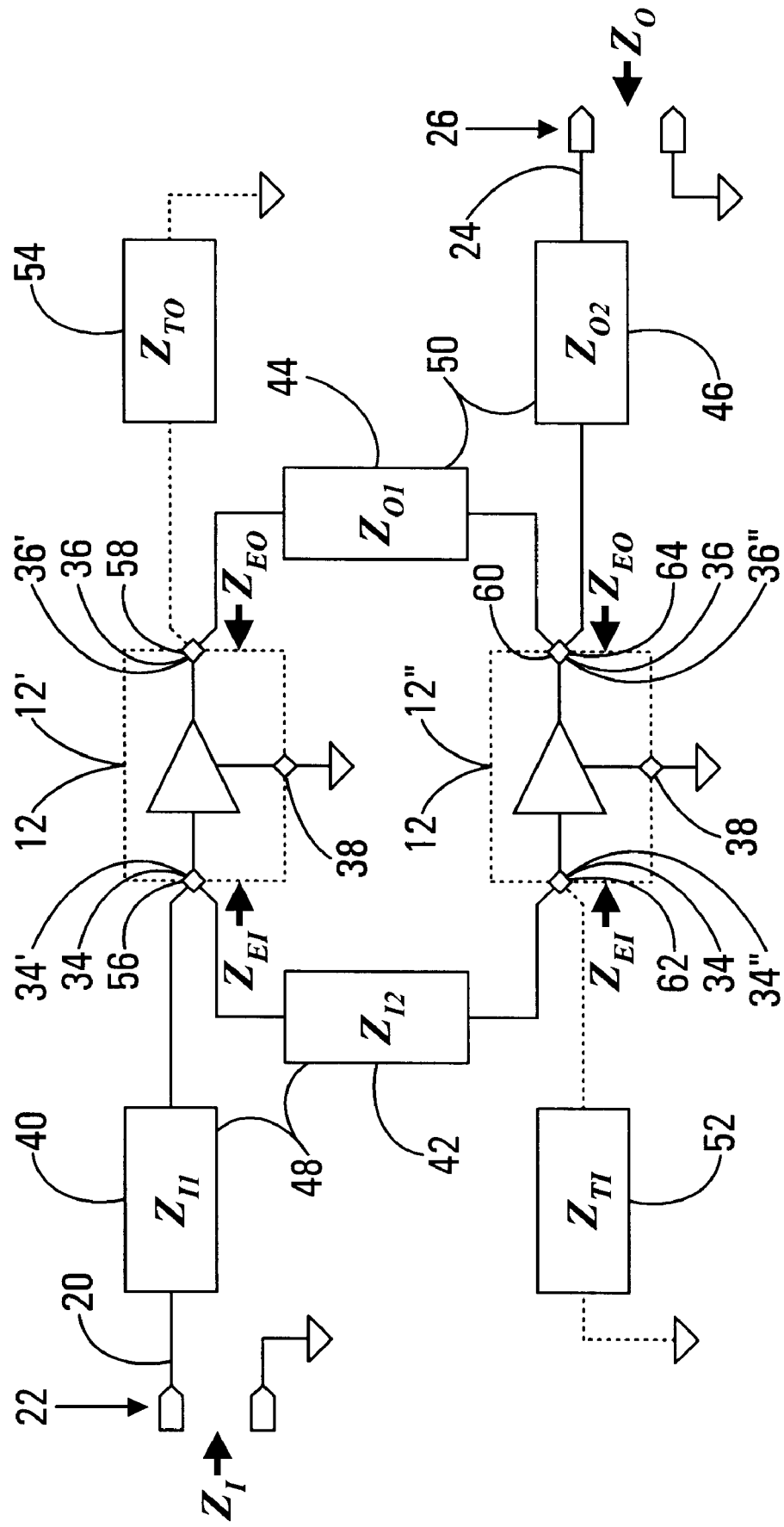
FIG. 1 depicts a schematic diagram of a distributed amplifier in accordance with a preferred embodiment of the present invention.
Figure 2:
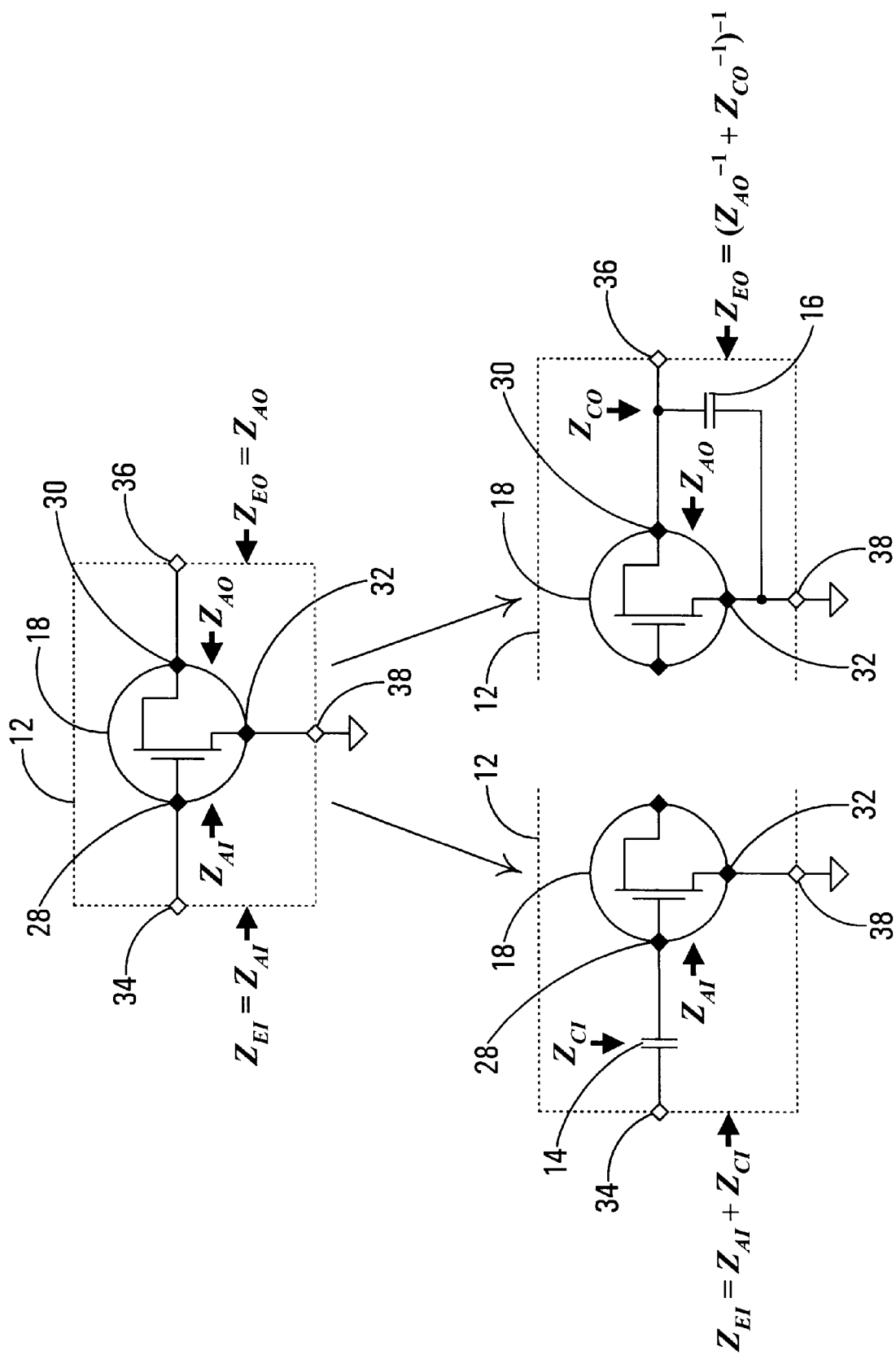
FIG. 2 depicts an effective active element of the distributed amplifier of FIG. 1 demonstrating the addition of an input padding capacitor and/or an output shunt capacitor to an active element therein in accordance with a preferred embodiment of the present invention.

FIG. 1 depicts a schematic diagram of a distributed amplifier 10, and FIG. 2 depicts an effective active element 12 of distributed amplifier 10 demonstrating the addition of an input padding capacitor 14 and/or an output shunt capacitor 16 to an active element 18 therein in accordance with a preferred embodiment of the present invention.

In distributed amplifier 10, an input signal 20 is received through an input port 22. Distributed amplifier 10 has an amplifier input impedance $Z_I$ at input port 22. This enables distributed amplifier 10 to be coupled either to an external input transmission line (not shown) having a characteristic impedance substantially equal to impedance $Z_I$, or to a prior circuit (not shown) having an output impedance substantially equal to impedance $Z_I$. In a preferred embodiment of the present invention, impedance $Z_I$ is equal to fifty ohms (50Ω) to allow distributed amplifier 10 to be coupled to a typical 50Ω transmission line.

Similarly, an output signal 24 is passed from distributed amplifier 10 through an output port 26. Distributed amplifier 10 has an amplifier output impedance $Z_O$ at output port 26. This enables distributed amplifier 10 to be coupled either to an external output transmission line (not shown) having a characteristic impedance substantially equal to impedance $Z_O$, or to a following circuit (not shown) having an input impedance substantially equal to impedance $Z_O$. In a preferred embodiment of the present invention, impedance $Z_O$ is equal to 50Ω to allow distributed amplifier 10 to be coupled to a standard 50Ω transmission line.

Those skilled in the art will appreciate that impedances $Z_I$ and $Z_O$ may be of any value required by the transmission lines or circuits coupled to distributed amplifier 10.

Distributed amplifier 10 utilizes a first effective active element 12' and a second effective active element 12", which together form a pair of substantially identical effective active elements 12. Each effective active element 12 contains an active element 18 (FIG. 2). Active element 18 is a three-terminal active element having an input terminal 28, an output terminal 30, and a common terminal 32.

In the preferred embodiment, first and second effective active elements 12' and 12" contain the only active elements 18 in distributed amplifier 10. Both active elements 18 are monolithic field-effect transistors formed upon a common substrate. Also, active elements 18 are configured as inverting amplifiers, with each transistor have its gate as input terminal 28, its drain as output terminal 30, and its source as common terminal 32.

Each active element 18 has an active-element input impedance $Z_{AI}$, as measured between input terminal 28 and common terminal 32, and an active-element output impedance $Z_{AO}$, as measured between output terminal 30 and common terminal 32. Impedances $Z_{AI}$ and $Z_{AO}$ are inherent properties of active element 18.

Each active element 18 couples to the remainder of distributed amplifier 10 at an input junction 34, an output junction 36, and a common junction 38, with input, output, and common junctions 34, 36, and 38 coupled to input, output, and common terminals 28, 30, and 32, respectively. Within the bounds of input, output, and common junctions 34, 36, and 38, active element 18 and other possible components discussed hereinbelow become effective active element 12. First effective active element 12' and second effective active element 12" are substantially identical for the preferred distributed amplifier 10.

Each effective active element 12 has an effective-active-element input impedance $Z_{EI}$, as measured between input junction 34 and common junction 38, and an effective-active-element output impedance $Z_{EO}$, as measured between output junction 36 and common junction 38. Unless additional components are added to alter impedance $Z_{EI}$ and/or impedance $Z_{EO}$, the values of impedances $Z_{EI}$ and $Z_{EO}$ are the values of impedances $Z_{AI}$ and $Z_{AO}$ (equations 1a and 2a).

$$Z_{EI} = Z_{AI} \tag{1a}$$

$$Z_{EO} = Z_{AO} \tag{2a}$$

Impedance $Z_{EI}$ may be too low for some intended designs. In such cases, impedance $Z_{EI}$ may be increased by placing input padding capacitor 14 in series with the input of active element 18, i.e., between input terminal 28 and input junction 34. Input padding capacitor 14 has an input-padding-capacitor impedance $Z_{CI}$. Since impedance $Z_{CI}$ is in series with impedance $Z_{AI}$, impedance $Z_{EI}$ becomes the vector sum of impedance $Z_{AI}$ plus impedance $Z_{CI}$ (equation 1b).

$$Z_{EI} = Z_{AI} + Z_{CI} \tag{1b}$$

Also, impedance $Z_{EO}$ may be too high for some intended designs. In such cases, impedance $Z_{EO}$ may be decreased by placing output shunt capacitor 16 in parallel with the output of active element 18, i.e., between output terminal 30 and common terminal 32. Output shunt capacitor 16 has an output-shunt-capacitor impedance $Z_{CO}$. Since impedance $Z_{CO}$ is in parallel with impedance $Z_{AO}$, impedance $Z_{EO}$ becomes the reciprocal of the vector sum of the reciprocal of impedance $Z_{AO}$ plus the reciprocal of impedance $Z_{CO}$ (equation 2b).

$$Z_{EO} = (Z_{AO}^{-1} + Z_{CO}^{-1})^{-1} \tag{2b}$$

Any impedance has a resistive part and a reactive part. The relationships between impedances $Z_{EI}$ and $Z_{EO}$ and their resistive parts $R_{EI}$ and $R_{EO}$ and reactive parts $X_{EI}$ and $X_{EO}$, respectively, are expressed by the well-known Pythagorean relationship familiar to those skilled in the art (equations 1c and 2c).

$$Z_{EI} = (R_{EI}^2 + X_{EI}^2)^{0.5} \tag{1c}$$

$$Z_{EO} = (R_{EO}^2 + X_{EO}^2)^{0.5} \tag{2c}$$

Distributed amplifier 10 amplifies input signal 20 to produce output signal 24. Input signal 20 possesses a predetermined wavelength λ, which determines both the frequency at which distributed amplifier 10 must operate and the impedances of its component parts. That is, amplifier impedances $Z_I$ and $Z_O$, active-element impedances $Z_{AI}$, and $Z_{AO}$, and capacitor impedances $Z_{CI}$ and $Z_{CO}$ (if used), are all functions of wavelength λ. Effective-active-element impedances $Z_{EI}$ and $Z_{EO}$, being derived from impedances $Z_{AI}$ and $Z_{CI}$ and $Z_{AO}$ and $Z_{CO}$, respectively, are also all functions of wavelength λ.

Distributed amplifier 10 also contains a first input phase-shift element 40, a second input phase-shift element 42, a first output phase-shift element 44, and a second output phase-shift element 46. Each phase-shift element 40, 42, 44, and 46 is configured to provide a phase shift of λ/4 at a different characteristic impedance. First and second input phase-shift elements 40 and 42 make up an input virtual transmission line 48 for distributed amplifier 10. Similarly, first and second output phase-shift elements 44 and 46 make up an output virtual transmission line 50. Since each phase-shift element 40, 42, 44, and 46 has a different characteristic impedance, virtual transmission lines 48 and 50 vary in impedance along their lengths.

Those skilled in the art will recognize that phase-shift elements 40, 42, 44, and 46 may be realized as quarter-wave transmission lines, lumped element compensatory networks, etc. In the preferred embodiment, phase-shift elements 40, 42, 44, and 46 are realized as stripline or microstrip devices, but lumped element compensatory networks become increasingly desirable as λ increases. The use of other forms of phase-shift elements 40, 42, 44, and 46 does not depart from either the intent or the scope of the present invention.

Second input phase-shift element 42 couples to second effective active element 12'' and a phantom input termination element 52 at second input junction 34''. Input termination element 52, discussed hereinbelow, has an input-termination impedance $Z_{TI}$ desirably much greater than, and at least five times greater than, $Z_{EI}$ and in parallel with impedance $Z_{EI}$. Impedance $Z_{TI}$, therefore, has negligible effect and may be ignored in the preferred embodiment. In essence, second input phase-shift element 42 may be taken to couple only with second effective active element 12'' at second input junction 34''. A second-input-phase-shift-element characteristic impedance $Z_{I2}$. (i.e., the impedance of second input phase-shift element 42) is therefore substantially equal to the conjugate of impedance $Z_{EI}$. Since all effective-active-element impedances are fundamentally negative-reactance (capacitive) impedances and all phase-shift-element impedances are fundamentally positive-reactance (inductive) impedances, setting the magnitude of a phase-shift-element impedance equal to the magnitude of an effective-active-element impedance effectively sets the phase-shift element impedance equal to the conjugate of the effective active-element impedance. Therefore, impedance $Z_{I2}$ is set equal to the magnitude of impedance $Z_{EI}$ (equation 3).

$$Z_{I2}=|Z_{EI}| \tag{3}$$

First input phase-shift element 40 couples to first effective active element 12' and second input phase-shift element 42 at first input junction 34'. First input phase-shift element 40 also establishes impedance $Z_I$. This results in first input phase-shift element 40 having a first-input-phase-shift-element characteristic impedance $Z_{I1}$ that is a function of impedance $Z_I$ and both the magnitude $|Z_{EI}|$ and the resistive part $R_{EI}$ of impedance $Z_{EI}$ (equation 4).

$$Z_{I1}=[(Z_I/2)(|Z_{EI}|^2/R_{EI})]^{0.5} \tag{4}$$

In an analogous manner, first output phase-shift element 44 couples to first effective active element 12' and a phantom output termination element 54 at first output junction 36'. Output termination element 54, discussed hereinbelow, has an output-termination impedance $Z_{TO}$ desirably much greater than, and at least five times greater than, impedance $Z_{EO}$ and in parallel with impedance $Z_{EO}$. Impedance $Z_{TO}$, therefore, has negligible effect and may be ignored in the preferred embodiment. In essence, first output phase-shift element 44 may be taken to couple only with first effective active element 12' at first output junction 36'. A first-output-phase-shift-element characteristic impedance $Z_{O1}$ (i.e., the impedance of first output phase-shift element 44) is therefore substantially equal to the magnitude of impedance $Z_{EO}$ (equation 5).

$$Z_{O1}=|Z_{EO}| \tag{5}$$

Second output phase-shift element 46 couples to second effective active element 12'' and first output phase-shift element 44 at second output junction 34'. Second output phase-shift element 46 also establishes impedance $Z_O$. This results in second output phase-shift element 46 having a second-output-phase-shift-element characteristic impedance $Z_{O2}$ that is a function of impedance $Z_O$ and the resistive part $R_{EO}$ of impedance $Z_{EO}$ (equation 6).

$$Z_{O2}=[(Z_O/2)R_{EO}]^{0.5} \tag{6}$$

Phantom input termination element 52 terminates input virtual transmission line 48. Input termination element 52 is normally not required as a discrete component. Since impedance $Z_{TI}$ is desirably much greater than impedance $Z_{EI}$, it has negligible effect upon the value of impedance $Z_{I2}$. In the preferred embodiment, input termination element 52 is realized as a leakage impedance parallel to impedance $Z_{EI}$, with impedance $Z_{TI}$ being at least five times as great as impedance $Z_{EI}$ (inequality 7).

$$Z_{TI}>5Z_{EI} \tag{7}$$

Similarly, phantom output termination element 54 terminates output virtual transmission line 50. Output termination element 54 is normally not required as a discrete component. Since impedance $Z_{TO}$ is much greater than impedance $Z_{EO}$, it has negligible effect upon the value of impedance $Z_{O1}$. In the preferred embodiment, output termination element 54 is realized as a leakage impedance parallel to impedance $Z_{EO}$, with impedance $Z_{TO}$ being at least five times as great as impedance $Z_{EO}$ (inequality 8).

$$Z_{TO}>5Z_{EO} \tag{8}$$

Those skilled in the art will appreciate that minor variations in the impedances determined by equations 1 through 6 and inequalities 7 and 8 are normal, and do not constitute a departure from either the spirit or the scope of the present invention.

In the preferred embodiment of FIG. 1, input signal 20 is received by distributed amplifier 10 through input port 22. From input port 22, input signal 20 then passes through first input phase-shift element 40 where it is shifted in phase by λ/4 to produce a first shifted input signal 56 at first input junction 34'. From first input junction 34', first shifted input signal 56 passes through first effective active element 12' where it is both amplified and shifted in phase by λ/2 to produce a first amplified signal 58 at first output junction 36'.

From first output junction 36', first amplified signal 58 passes through first output phase-shift element 44 where it is shifted in phase by λ/4 to produce a first shifted amplified signal 60 at second output junction 36".

From first input junction 34', first shifted input signal 56 also passes through second input phase-shift element 42 where it is shifted in phase by λ/4 to produce a second shifted input signal 62 at second input junction 34". From second input junction 34", second shifted input signal 62 passes through second effective active element 12" where it is both amplified and shifted in phase by λ/2 to produce a second amplified signal 64 at second output junction 36". From second output junction 36", first shifted amplified signal 60 and second amplified signal 64 are passed through second phase-shift element 46 where they are combined and shifted in phase by λ/4 to produce output signal 24 at output port 26. Output signal 24 is passed from distributed amplifier 10 through output port 26.

In summary, the present invention teaches a two-stage distributed amplifier 10 suitable for microwave or millimeter-wave application where efficient use is made of monolithic amplifier active-element pairs 12, typically power field-effect transistors. Distributed amplifier 10 taught herein utilizes conjugate matching to provide a moderate-bandwidth, low-loss, minimum-component amplifier 10 utilizing input and output virtual transmission lines 48 and 50 that vary in impedance over their lengths.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A distributed amplifier configured to amplify an input signal possessing a predetermined wavelength λ, said distributed amplifier comprising:

a first input phase-shift element configured to shift said input signal in phase by an amount substantially equal to λ/4 and to produce a first shifted input signal;

a first active element configured to receive said first shifted input signal to produce a first amplified signal;

a second phase-shift element configured to shift said first shifted input signal in phase by an amount substantially equal to λ/4 and to produce a second shifted input signal;

a second active element having an effective-active-element input impedance for said input signal and being configured to receive said second shifted input signal and to produce a second amplified signal;

an input termination element coupled to said second phase-shift element and said second active element, said input termination element presenting an impedance to said input signal that is greater than five times said effective-active-element input impedance;

a first output phase-shift element configured to shift said first amplified signal in phase by an amount substantially equal to λ/4 and to produce a first shifted amplified signal; and a second output phase-shift element configured to shift said first shifted amplified signal and said second amplified signal in phase by an amount substantially equal to λ/4 and to produce an output signal.

2. A distributed amplifier as claimed in claim 1 wherein said first active element and said second active element are substantially identical.

3. A distributed amplifier configured to amplify an input signal possessing a predetermined wavelength λ, said distributed amplifier comprising:

an input port having an amplifier input impedance $Z_I$;

a first input phase-shift element configured to shift said input signal in phase by an amount substantially equal to λ/4 and to produce a first shifted input signal;

a first active element configured to receive said first shifted input signal to produce a first amplified signal;

a second phase-shift element configured to shift said first shifted input signal in phase by an amount substantially equal to λ/4 and to produce a second shifted input signal;

a second active element configured to be substantially identical to said first active element, to receive said second shifted input signal, and to produce a second amplified signal;

a first output phase-shift element configured to shift said first amplified signal in phase by an amount substantially equal to λ/4 and to produce a first shifted amplified signal; and a second output phase-shift element configured to shift said first shifted amplified signal and said second amplified signal in phase by an amount substantially equal to λ/4 and to produce an output signal; and an output port having an amplifier output impedance $Z_O$; wherein, each of said first and second active elements has an effective-active-element input impedance $Z_{EI}$ having a resistive part $R_{EI}$ and a reactive part $X_{EI}$, wherein $Z_{EI}=(R_{EI}^2+X_{EI}^2)^{0.5}$;

each of said first and second active elements has an effective-active-element output impedance $Z_{EO}$ having a resistive part $R_{EO}$ and a reactive part $X_{EO}$, wherein $Z_{EO}=(R_{EO}^2+X_{EO}^2)^{0.5}$;

said first input phase-shift element has a characteristic impedance $Z_{I1}$ substantially equal to $[(Z_1/2)(|Z_{EI}|^2/R_{EI})]^{0.5}$;

said second phase-shift element has a characteristic impedance $Z_{I2}$ substantially equal to $|Z_{EI}|$;

said first output phase-shift element has a characteristic impedance $Z_{O1}$ substantially equal to $|Z_{EO}|$; and said second output phase-shift element has a characteristic impedance $Z_{O2}$ substantially equal to $[(Z_O/2)R_{EO}]^{0.5}$.

4. A distributed amplifier as claimed in claim 1 wherein:

said distributed amplifier has an input port having an amplifier input impedance $Z_I$ and an output port having an amplifier output impedance $Z_O$;

said first input phase-shift element is coupled to said input port;

said first active element is coupled to said first input phase-shift element;

said second phase-shift element is coupled to said first input phase-shift element and said second active element;

said first output phase-shift element is coupled to said first active element;

said second output phase-shift element is coupled to said first output phase-shift element, said second active element, said output port.

5. A distributed amplifier configured to amplify an input signal possessing a predetermined wavelength λ, said distributed amplifier comprising:

a first input phase-shift element configured to shift said input signal in phase by an amount substantially equal to $\lambda/4$ and to produce a first shifted input signal;

a first active element configured to receive said first shifted input signal to produce a first amplified signal;

a second phase-shift element configured to shift said first shifted input signal in phase by an amount substantially equal to $\lambda/4$ and to produce a second shifted input signal;

a second active element configured to receive said second shifted input signal and to produce a second amplified signal;

a first output phase-shift element configured to shift said first amplified signal in phase by an amount substantially equal to $\lambda/4$ and to produce a first shifted amplified signal; and a second output phase-shift element configured to shift said first shifted amplified signal and said second amplified signal in phase by an amount substantially equal to $\lambda/4$ and to produce an output signal; wherein, said first active element and said second active element are three-terminal active elements, each of which has an input terminal, an output terminal, and a common terminal;

each of said first and second active elements has, between said input and common terminals, an active-element input impedance $Z_{AI}$;

each of said first and second active elements has, between said output and common terminals, an active-element output impedance $Z_{AO}$;

said input terminal of said first active element is coupled to said first input phase-shift element at a first input junction such that said first active element has, between said first input junction and said common terminal, an effective-active-element input impedance $Z_{EI}$, wherein said effective-active-element input impedance $Z_{EI}$ has a resistive part $R_{EI}$ and a reactive part $X_{EI}$, and $Z_{EI} = (R_{EI}^2 + X_{EI}^2)^{0.5}$;

said input terminal of said second active element is coupled to said second phase-shift element at a second input junction such that said second active element has, between said second input junction and said common terminal, an effective-active-element input impedance substantially equal to $Z_{EI}$;

said output terminal of said first active element is coupled to said first output phase-shift element at a first output junction such that said first active element has, between said first output junction and said common terminal, an effective-active-element output impedance $Z_{EO}$, wherein said effective-active-element output impedance $Z_{EO}$ has a resistive part $R_{EO}$ and a reactive part $X_{EO}$, and $Z_{EO} = (R_{EO}^2 + X_{EO}^2)^{0.5}$;

said output terminal of said second active element is coupled to said second output phase-shift element at a second output junction such that said second active element has, between said second output junction and said common terminal, an effective-active-element output impedance substantially equal to $Z_{EO}$;

said first input phase-shift element has a characteristic impedance $Z_{I1}$ substantially equal to $[(Z_I/2)(|Z_{EI}|^2/R_{EI})]^{0.5}$;

said second phase-shift element has a characteristic impedance $Z_{I2}$ substantially equal to $|Z_{EI}|$;

said first output phase-shift element has a characteristic impedance $Z_{O1}$ substantially equal to $|Z_{EO}|$; and said second output phase-shift element has a characteristic impedance $Z_{O2}$ substantially equal to $[(Z_O/2)R_{EO}]^{0.5}$.

6. A distributed amplifier as claimed in claim 5 wherein:

said effective-active-element input impedance $Z_{EI}$ is substantially equal to said active-element input impedance $Z_{AI}$; and said effective-active-element output impedance $Z_{EO}$ is substantially equal to said active-element output impedance $Z_{AO}$.

7. A distributed amplifier as claimed in claim 5 wherein:

an input padding capacitor having an impedance $Z_{CI}$ is coupled between one of said first and second input junctions and said input terminal of one of said first and second active elements, respectively; and said effective-active-element input impedance $Z_{EI}$ is substantially equal to $Z_{AI} + Z_{CI}$.

8. A distributed amplifier as claimed in claim 5 wherein:

an output shunt capacitor having an impedance $Z_{CO}$ is coupled between one of said first and second output junctions and said common terminal of one of said first and second active elements, respectively; and said effective-active-element output impedance $Z_{EO}$ is substantially equal to $(Z_{AO}^{-1} + Z_{CO}^{-1})^{-1}$.

9. A distributed amplifier as claimed in claim 5 additionally comprising an input termination element coupled to said second phase-shift element and said second active element, and having an impedance $Z_{TI}$ greater than five times said effective-active-element input impedance $Z_{EI}$.

10. A distributed amplifier as claimed in claim 5 additionally comprising an output termination element coupled to said first active element and said first output phase-shift element, and having an impedance $Z_{TO}$ greater than five times said effective-active-element output impedance $Z_{EO}$.

11. A distributed amplifier as claimed in claim 1 wherein said first active element and said second active element are monolithic active elements sharing a common substrate.

12. A distributed amplifier as claimed in claim 1 wherein said first active element and said second active element are substantially identical three-terminal inverting active elements, each of which has an input terminal, an output terminal, and a common terminal, wherein a signal is shifted in phase by an amount substantially equal to $\lambda/2$ between said input terminal and said output terminal.

13. A distributed amplifier as claimed in claim 12 wherein said first and second active elements are monolithic field-effect transistors sharing a common substrate, and wherein, for each of said field effect transistors, said input terminal is a gate thereof, said output terminal is a drain thereof, and said common terminal is a source thereof.

14. A distributed amplifier configured to amplify an input signal possessing a predetermined wavelength $\lambda$, said distributed amplifier comprising:

a first input phase-shift element configured to shift said input signal in phase by an amount substantially equal to $\lambda/4$ and to produce a first shifted input signal;

a first active element configured to receive said first shifted input signal to produce a first amplified signal;

a second phase-shift element configured to shift said first shifted input signal in phase by an amount substantially equal to $\lambda/4$ and to produce a second shifted input signal;

a second active element configured to receive said second shifted input signal and to produce a second amplified signal;

a first output phase-shift element configured to shift said first amplified signal in phase by an amount substantially equal to $\lambda/4$ and to produce a first shifted amplified signal; and a second output phase-shift element configured to shift said first shifted amplified signal and said second amplified signal in phase by an amount substantially equal to $\lambda/4$ and to produce an output signal; wherein, said first active element and said second active element are the only active elements in said distributed amplifier; and said first active element and said second active element are monolithic active elements sharing a common substrate.

15. A method to distributively amplify an input signal possessing a predetermined wavelength $\lambda$, said method comprising:

a) shifting said input signal in phase by an amount substantially equal to $\lambda/4$ to produce a first shifted input signal;

b) amplifying said first shifted input signal to produce a first amplified signal using a first active element, wherein said first active element has an effective-active-element input impedance $Z_{EI}$ having a resistive part $R_{EI}$ and a reactive part $X_{EI}$, wherein $Z_{EO}=(R_{EI}^2+X_{EI}^2)^{0.5}$, and an effective-active-element output impedance $Z_{EO}$ having a resistive part $R_{EO}$ and a reactive part $X_{EO}$, wherein $Z_{EO}=(R_{EO}^2+X_{EO}^2)^{0.5}$;

c) shifting said first amplified signal in phase by an amount substantially equal to $\lambda/4$ to produce a first shifted amplified signal;

d) shifting said first shifted input signal in phase by an amount substantially equal to $\lambda/4$ to produce a second shifted input signal;

e) amplifying said second shifted input signal to produce a second amplified signal using a second active element, wherein said second active element is substantially identical to said first active element; and f) shifting said first shifted amplified signal and said second amplified signal in phase by an amount substantially equal to $\lambda/4$ to produce an output signal.

16. A method as claimed in claim 15 additionally comprising:

receiving, prior to said shifting operation a), said input signal though an input port having an amplifier input impedance $Z_I$;

passing, after said shifting operation f), said output signal through an output port having an amplifier output impedance $Z_O$;

configuring, prior to said shifting operation a), a first input phase-shift element to have a characteristic impedance $Z_{I1}$ substantially equal to $[(Z_I/2)(|Z_{EI}|^2/R_{EI})]^{0.5}$, and to perform said shifting operation a);

configuring, prior to said shifting operation c), a first output phase-shift element to have a characteristic impedance $Z_{O1}$ substantially equal to $|Z_{EO}|$, and to perform said shifting operation c);

configuring, prior to said shifting operation d), a second phase-shift element to have a characteristic impedance $Z_{I2}$ substantially equal to $|Z_{EI}|$, and to perform said shifting operation d); and configuring, prior to said shifting operation f), a second output phase-shift element to have a characteristic impedance $Z_{O2}$ substantially equal to $[(Z_O/2)R_{EO}]^{0.5}$, and to perform said shifting operation f).

17. A method as claimed in claim 15 additionally comprising configuring said first active element and said second active element as monolithic active elements sharing a common substrate.

18. A method as claimed in claim 15 additionally comprising:

configuring said first active element and said second active element as substantially identical three-terminal inverting active elements;

configuring each of said first and second active elements to have an input terminal, an output terminal, and a common terminal; and shifting a signal in phase by an amount substantially equal to $\lambda/2$ between said input terminal and said output terminal of each of said first and second active elements.

19. A distributed amplifier configured to amplify an input signal possessing a predetermined wavelength $\lambda$, said distributed amplifier comprising:

a first input phase-shift element configured to produce a first shifted input signal by shifting said input signal in phase by an amount substantially equal to $\lambda/4$;

a first active element coupled to said first input phase-shift element and configured to produce a first amplified signal by amplifying said first shifted input signal;

a second phase-shift element coupled to said first input phase-shift element and said first active element, and configured to produce a second shifted input signal by shifting said first shifted input signal in phase by an amount substantially equal to $\lambda/4$;

a second active element coupled to said second phase-shift element and configured to produce a second amplified signal by amplifying said second shifted input signal, said second active element having an effective-active-element input impedance for said input signal;

an input termination element coupled to said second phase-shift element and said second active element, said input termination element presenting an impedance to said input signal that is greater than five times said effective-active-element input impedance;

a first output phase-shift element coupled to said first active element and configured to produce a first shifted amplified signal by shifting said first amplified signal in phase by an amount substantially equal to $\lambda/4$; and a second output phase-shift element coupled to said first output phase-shift element and said second active element, and configured to produce an output signal by shifting said first shifted amplified signal and said second amplified signal in phase by an amount substantially equal to $\lambda/4$.

20. A distributed amplifier as claimed in claim 1 wherein:

said first active element has an effective-active-element output impedance; and said amplifier additionally comprises an output termination element coupled to said first active element and said first output phase-shift element, said output termination element having an impedance greater than five times said effective-active-element output impedance.

21. A distributed amplifier as claimed in claim 1 wherein:

said first input phase-shift element and said second phase-shift element have characteristic impedances which differ from each other; and said first and second output phase-shift elements have characteristic impedances which differ from each other.

* * * * *